United States Patent
Morita et al.

(10) Patent No.: US 10,717,076 B2
(45) Date of Patent: Jul. 21, 2020

(54) METAL CONTAMINATION INHIBITOR, METAL CONTAMINATION INHIBITION MEMBRANE, METHOD FOR PREVENTING METAL CONTAMINATION, AND METHOD FOR CLEANING PRODUCT

(71) Applicant: KURITA WATER INDUSTRIES LTD., Tokyo (JP)

(72) Inventors: Hiroshi Morita, Tokyo (JP); Toshimasa Kato, Tokyo (JP); Shigeyuki Hoshi, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 51 days.

(21) Appl. No.: 15/760,507

(22) PCT Filed: Sep. 12, 2016

(86) PCT No.: PCT/JP2016/076823
§ 371 (c)(1),
(2) Date: Mar. 15, 2018

(87) PCT Pub. No.: WO2017/056947
PCT Pub. Date: Apr. 6, 2017

(65) Prior Publication Data
US 2018/0257066 A1    Sep. 13, 2018

(30) Foreign Application Priority Data
Sep. 30, 2015   (JP) .................................. 2015-193799

(51) Int. Cl.
*B01J 39/04* (2017.01)
*H01L 21/02* (2006.01)
(Continued)

(52) U.S. Cl.
CPC ............... *B01J 39/04* (2013.01); *B01J 41/04* (2013.01); *B01J 47/12* (2013.01); *C02F 1/42* (2013.01);
(Continued)

(58) Field of Classification Search
USPC .......................... 210/696–701; 252/175–181
See application file for complete search history.

(56) References Cited

U.S. PATENT DOCUMENTS

| | | | |
|---|---|---|---|
| 2008/0173328 A1* | 7/2008 | Nishiwaki | ................ C11D 1/22 134/6 |
| 2010/0025329 A1* | 2/2010 | Kawakatsu | ............ B01D 61/04 210/638 |

(Continued)

FOREIGN PATENT DOCUMENTS

| CN | 102245750 A | 11/2011 |
|---|---|---|
| CN | 102549722 A | 7/2012 |

(Continued)

OTHER PUBLICATIONS

Bhattacharyya et al. (Journal of Membrane Science, 1998, 141, 121-135). (Year: 1998).*

(Continued)

*Primary Examiner* — Clare M Perrin
(74) *Attorney, Agent, or Firm* — Manabu Kanesaka

(57) ABSTRACT

The present invention reduces adhesion of trace metals in ultrapure water for cleaning products, and inhibits the metal contamination of an object to be cleaned. Provided is a metal contamination inhibitor that contains a polymer having an ion-exchange group, such as a polystyrene sulfonate having a molecular weight of at least 100,000. Trace metals in ultrapure water are adsorbed through an ion-exchange reaction of the polymer having the ion-exchange group, and can thus be inhibited from adhering to products. Also provided (Continued)

is a method for cleaning a product with ultrapure water to which the metal contamination inhibitor has been added. Preferably, the ultrapure water to which the metal contamination inhibitor has been added flows through a separation membrane module, and the products are cleaned with permeated water.

4 Claims, 6 Drawing Sheets

(51) Int. Cl.
    *C02F 1/44*     (2006.01)
    *C02F 1/62*     (2006.01)
    *B01J 47/12*     (2017.01)
    *C02F 1/42*     (2006.01)
    *B01J 41/04*     (2017.01)
    *H01L 21/67*     (2006.01)
    *C02F 101/20*     (2006.01)
    *C02F 103/04*     (2006.01)

(52) U.S. Cl.
    CPC ............... *C02F 1/444* (2013.01); *C02F 1/62* (2013.01); *H01L 21/02052* (2013.01); *C02F 2101/20* (2013.01); *C02F 2103/04* (2013.01); *H01L 21/67057* (2013.01)

(56) References Cited

U.S. PATENT DOCUMENTS

2011/0259818 A1    10/2011    Tamada et al.
2012/0172273 A1*    7/2012    Mizuniwa ......... H01L 21/02052
                                                510/175

FOREIGN PATENT DOCUMENTS

| | | | | |
|---|---|---|---|---|
| JP | 2001-047066 | A | | 2/2001 |
| JP | 2001047066 | A | * | 2/2001 |
| JP | 2003-334550 | A | | 11/2003 |
| JP | 2004-283747 | A | | 10/2004 |
| JP | 2007-335856 | A | | 12/2007 |
| JP | 2008-066658 | A | | 3/2008 |
| JP | 2011-231163 | A | | 11/2011 |
| JP | 2011231163 | A | * | 11/2011 ......... B01D 39/1623 |
| JP | 2013-188692 | A | | 9/2013 |
| JP | 2014-141668 | A | | 12/2013 |

OTHER PUBLICATIONS

Machine translation of Takahito et al. (JP 2001047066), pp. 1-5. (Year: 2001).*
Machine translation of Masao et al. (JP 2011231163), pp. 1-11. (Year: 2011).*
Hashimoto et al. (Solid State Phenomena, 2005, 103-104, 265-268). (Year: 2005).*
PCT/ISA/210, "International Search Report for International Application No. PCT/JP2016/076823," dated Nov. 22, 2016.
Japanese Patent Office, "Office Action for Japanese Patent Application No. 2015-193799," dated Aug. 22, 2017.
Japanese Patent Office, "Office Action for Japanese Patent Application No. 2015-193799," dated Nov. 10, 2016.
Japanese Patent Office, "Office Action for Japanese Patent Application No. 2015-193799," dated Jun. 9, 2017.

* cited by examiner

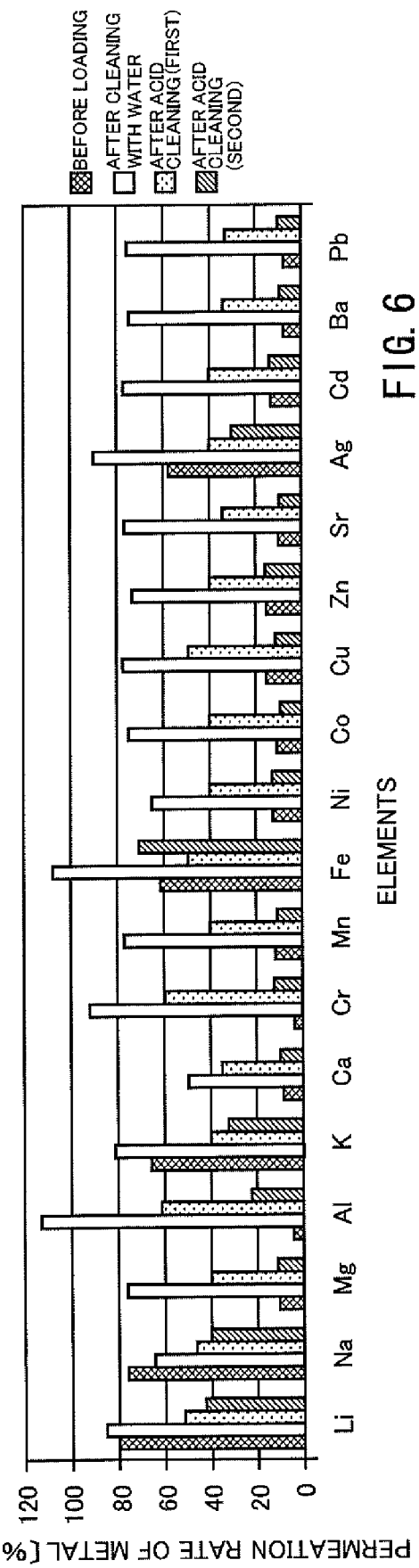

METAL CONTAMINATION INHIBITOR, METAL CONTAMINATION INHIBITION MEMBRANE, METHOD FOR PREVENTING METAL CONTAMINATION, AND METHOD FOR CLEANING PRODUCT

TECHNICAL FIELD

The present invention relates to a metal contamination inhibitor and a metal contamination inhibition membrane that reduce the metal contamination of ultrapure water. The present invention relates specifically to a metal contamination inhibitor and a metal contamination inhibition membrane that are used in various industrial fields, such as the semiconductor industry, the power and nuclear industry, and the medical industry, for preventing defects of products in a simple and easy manner, the defects of products being caused by the metal contamination of the products by trace metals and ions contained in ultrapure water adhered to the products when the products are cleaned with the ultrapure water. The present invention also relates to a method for preventing metal contamination and a method for cleaning a product in which the above-described metal contamination inhibitor is used.

BACKGROUND ART

When wafers used as a substrate in the production of semiconductors are cleaned, the wafers are cleaned with various chemicals and subsequently rinsed with ultrapure water. The rinsing of wafers is performed using ultrapure water that is high-purity water from which impurities have been removed at a high level.

However, even the ultrapure water used for cleaning wafers may still contain trace metals. The trace metals contained in ultrapure water may adhere to wafers when the wafers are cleaned. Consequently, the wafers may become contaminated with the metals.

In order to reduce the metal contamination of products in the product-cleaning step, in the production of ultrapure water, commonly, several attempts have been made to increase the purity of ultrapure water by, for example, the refining of a deminar, the use of low-elution piping members or charged UF membranes, special pipe cleaning, or any combination thereof. However, all the above approaches increase the costs for an ultrapure water production facility. In addition, applying any of the above approaches to an already-existing facility may disadvantageously increase the amount of downtime required by the reconstruction work.

It is described in PTL 1 and PTL 2 that polystyrene sulfonic acid, a polystyrene-based quaternary ammonium salt, and the like contained in ultrapure water may contribute to the contamination of wafers and, therefore, it is necessary to reduce the contents of the above substances in ultrapure water.

In PTL 3, an agent for cleaning electronic materials which includes a quaternary ammonium salt (B) of an organic acid (A) is described. It is described in PTL 3 that particles can be removed without degrading the surfaces of wafers with an alkali metal. It is described in PTL 3 that, specifically, cleaning can be performed at a high level by preventing the particles removed from the cleaning target during cleaning from adhering again onto the cleaned surface of the target. However, there is no mention of a reduction in contamination caused by trace metals contained in the ultrapure water.

PTL 4 discloses a cleaning agent used for removing particles, the cleaning agent including a salt of polystyrene sulfonic acid as a surfactant. Similarly to PTL 3, there is no mention of a reduction in contamination caused by trace metals contained in the ultrapure water.

PTL 1: Japanese Patent Publication 2003-334550 A
PTL 2: Japanese Patent Publication 2004-283747 A
PTL 3: Japanese Patent Publication 2007-335856 A
PTL 4: Japanese Patent Publication 2014-141668 A

SUMMARY OF INVENTION

An object of the present invention is to provide a metal contamination inhibitor capable of inhibiting the metal contamination of a cleaning target by reducing the adhesion of trace metals contained in ultrapure water or, in particular, ultrapure water used for cleaning products; a metal contamination inhibition membrane including the metal contamination inhibitor; and a method for preventing metal contamination and a method for cleaning a product in which the metal contamination inhibitor is used.

The inventors of the present invention conducted extensive studies in order to address the above issues and, as a result, found that the above issues may be addressed by adding a polymer including an ion-exchange group to ultrapure water. Thus, the present invention was made.

Specifically, the summary of the present invention is as follows.

[1] A metal contamination inhibitor to be added to ultrapure water in order to reduce contamination of the ultrapure water with a trace metal contained in the ultrapure water, the metal contamination inhibitor comprising a polymer including an ion-exchange group.

[2] The metal contamination inhibitor according to [1], wherein the polymer is a polymer including either a sulfonic acid group or a quaternary ammonium group.

[3] The metal contamination inhibitor according to [1] or [2], wherein the polymer has a molecular weight of 100 thousand or more.

[4] The metal contamination inhibitor according to [2] or [3], wherein the polymer is polystyrene sulfonic acid.

[5] The metal contamination inhibitor according to any one of [1] to [4], wherein the trace metal is a metal having a valence of two or more.

[6] The metal contamination inhibitor according to any one of [1] to [5], the metal contamination inhibitor being added to the ultrapure water at a position upstream of a separation membrane.

[7] A method for preventing metal contamination of a product brought into contact with ultrapure water by a trace metal contained in the ultrapure water, the method comprising adding the metal contamination inhibitor according to any one of [1] to [6] to the ultrapure water.

[8] The method for preventing metal contamination according to [7], the method further comprising, subsequent to adding the metal contamination inhibitor to the ultrapure water, passing the water through a module including a separation membrane, and bringing water passed through the membrane into contact with the product.

[9] A method for cleaning a product, the method comprising adding the metal contamination inhibitor according to any one of [1] to [6] to ultrapure water, and cleaning a product with the ultrapure water.

[10] The method for cleaning a product according to [9], the method further comprising, subsequent to adding the metal contamination inhibitor to the ultrapure water, passing the water through a module including a separation membrane, and cleaning the product with water passed through the membrane.

[11] A metal contamination inhibition membrane comprising the metal contamination inhibitor according to any one of [1] to [6], the metal contamination inhibitor being deposited or fixed on the metal contamination inhibition membrane.

Advantageous Effects of Invention

When the metal contamination inhibitor according to the present invention is added to ultrapure water, trace metals contained in the ultrapure water become adsorbed to the polymer including an ion-exchange group as a result of an ion-exchange reaction and, consequently, the adhesion of the trace metals to a product can be inhibited. In other words, the metal contamination of ultrapure water can be reduced by only adding the metal contamination inhibitor according to the present invention to the ultrapure water.

Accordingly, the metal contamination inhibition membrane according to the present invention which includes the above-described metal contamination inhibitor according to the present invention and the method for preventing metal contamination in which the metal contamination inhibitor is used are capable of effectively preventing the metal contamination of a product by trace metals contained in ultrapure water. The method for cleaning a product according to the present invention is capable of efficiently cleaning a product with ultrapure water while preventing the metal contamination of the product.

BRIEF DESCRIPTION OF DRAWINGS

FIG. 6 is a graph illustrating the results obtained in Example III-1 of Test III.

DESCRIPTION OF EMBODIMENTS

Figure 1:
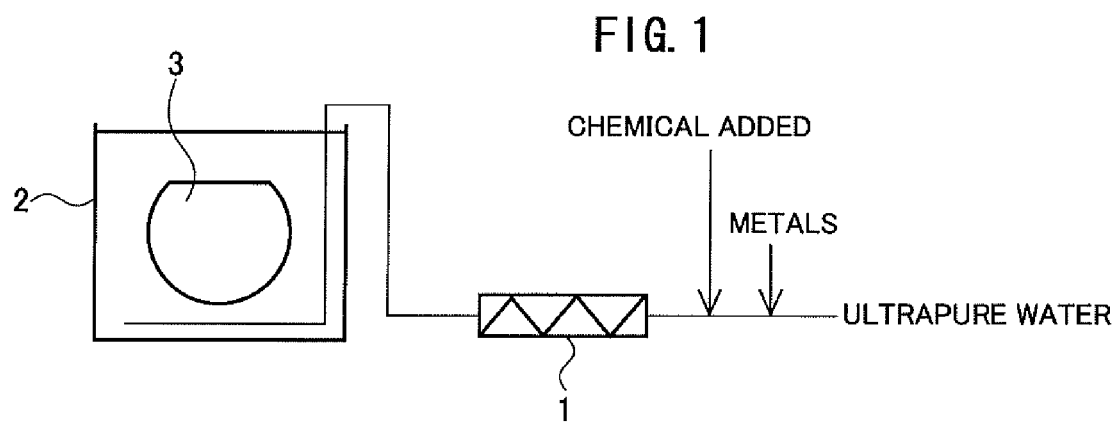
FIG. 1 is a system diagram illustrating a cleaning test apparatus used in Test I.

An embodiment of the present invention is described below in detail.

The ultrapure water to which the metal contamination inhibitor according to the present invention is added is high-purity water used in the fields of semiconductors, electronic components, precision equipment, medical care, and the like, commonly for cleaning materials, components, instruments, and the like (hereinafter, the above items may be referred to collectively as "product").

The trace metals contained in the ultrapure water which are to be removed in the present invention are trace metals that cannot be removed in the ultrapure water production process and remain in the ultrapure water in trace amounts.

Examples of the trace metals contained in the ultrapure water include monovalent metals, such as Na, K, Li, and Ag, and polyvalent metals having a valence of two or more, such as Mg, Al, Ca, Cr, Mn, Fe, Ni, Co, Cu, Zn, Sr, Cd, Ba, and Pb. The above metals are present in the ultrapure water in the form of metal ions. The content of each of the trace metals in the ultrapure water used for cleaning various products is normally 1 ng/L or less, which is about 0.01 to 0.5 ng/L, for example. The total concentration of the trace metals in the ultrapure water is normally 5 ng/L or less, which is about 0.01 to 1 ng/L, for example.

In the present invention, the trace metals are caused to adsorb to a polymer including an ion-exchange group by an ion-exchange reaction between the trace metals and the polymer including an ion-exchange group. This prevents the trace metals from adhering to products. In consideration of ion-exchange reactivity, the metal contamination inhibitor according to the present invention is effective particularly against polyvalent metal ions.

The ion-exchange group included in the polymer including an ion-exchange group used in the present invention may be any ion-exchange group capable of adsorbing the metal ions thereto as a result of an ion-exchange reaction between the ion-exchange group and the metal ions. Examples of such an ion-exchange group include a carboxyl group, a sulfonic acid group, a quaternary ammonium group, and a tertiary amino group.

Among the above ion-exchange groups, a sulfonic acid group and a quaternary ammonium group are preferable in consideration of ion-exchange reactivity. A sulfonic acid group has a high capability to adsorb metal cations thereto.

The polymer including an ion-exchange group may include only one of the above ion-exchange groups or two or more of the above ion-exchange groups.

Specific examples of the polymer including an ion-exchange group include a polymer including a sulfonic acid group, such as polystyrene sulfonic acid (PSA), and a polymer including a quaternary ammonium group, such as a polystyrene-based quaternary ammonium salt (e.g., a polytrimethylbenzylammonium salt or a polytrimethylstyrylalkylammonium salt). The metal contamination inhibitor according to the present invention may include only one of the above polymers including an ion-exchange group or two or more of the above polymers including an ion-exchange group.

The molecular weight (hereinafter, the term "molecular weight" refers to weight-average molecular weight determined by gel permeation chromatography using polyethylene glycol standards) of the polymer including an ion-exchange group is preferably 10 thousand or more. When the polymer has a molecular weight of 10 thousand or more, the polymer is capable of inhibiting the contamination by adsorbing metals as a result of the ion-exchange reaction. In a low-concentration range, the higher the molecular weight of the polymer, the larger the above advantageous effect. Therefore, the molecular weight of the polymer including an ion-exchange group is preferably 100 thousand or more. The molecular weight of the polymer including an ion-exchange group is preferably 100 thousand or more in consideration also of removal of the polymer through the separation membrane described below.

The amount of metal contamination inhibitor according to the present invention to ultrapure water is determined appropriately in accordance with the contents of the trace metals in the ultrapure water. It is preferable to add the metal contamination inhibitor to ultrapure water such that the ion-exchange reaction equivalent ratio between the polymer including an ion-exchange group and the metals contained in the ultrapure water is reached or exceeded. If the amount of the metal contamination inhibitor added to the ultrapure water is excessively large, the metal contamination inhibitor may leak onto the treated-water side or may increase pressure difference due to the retention of the metal contamination inhibitor. Furthermore, the cost for the metal contamination inhibitor is increased. Accordingly, it is preferable to use the metal contamination inhibitor such that a ratio 1 to 20 times or, in particular, about 1.1 to 5 times the ion-exchange reaction equivalent ratio is achieved.

If the amount of polymer including an ion-exchange group added to the ultrapure water is excessively small, it may not be possible to effectively prevent the contamination by using the polymer including an ion-exchange group. On the other hand, if the amount of polymer including an ion-exchange group added to the ultrapure water is excessively large, the polymer may cause contamination. Moreover, in the case where the water is passed through the separation membrane described below, the separation membrane may become clogged at an early stage disadvantageously.

In the present invention, ultrapure water to which the metal contamination inhibitor has been added may be passed through a module including a separation membrane in order to remove the polymer including an ion-exchange group to which the metals contained in the water have been adsorbed and captured. The treated water may be used for, for example, cleaning products. Removing the polymer including an ion-exchange group to which the metals have been adsorbed and captured by membrane separation may further reduce the metal contamination of ultrapure water.

In such a case, since the metal ions contained in the water are present in the form of cations except some cases, it is preferable to use a polymer including a cation-exchange group as a polymer including an ion-exchange group in order to remove the metal cations through the separation membrane by adsorbing the metal cations to the polymer including a cation-exchange group. As a polymer including a cation-exchange group, a polymer including a sulfonic acid group having a large cation-exchange capacity and, in particular, polystyrene sulfonic acid are suitably used.

Examples of the separation membrane include a microfiltration (MF) membrane, an ultrafiltration (UF) membrane, a nanofiltration (NF) membrane, and a reverse osmosis (RO) membrane. It is preferable to use a UF membrane, which is capable of efficiently removing a polymer having a molecular weight of about 10 thousand to several million on which metal ions are adsorbed. The cut-off molecular weight of the UF membrane is preferably about 1000 to 100 thousand and is particularly preferably about 1000 to 10 thousand in consideration of the efficiency of the removal of the polymer on which metal ions are adsorbed.

Although the separation membrane may have any shape, it is preferable to use a hollow fiber membrane module that enables the metal contamination inhibitor added to the water to be quickly discharged onto the concentrate side and prevents the retention of the metal contamination inhibitor.

When ultrapure water to which the metal contamination inhibitor according to the present invention has been added is passed through the separation membrane module, a part of the amount of the polymer including an ion-exchange group, which is included in the metal contamination inhibitor, enters the concentrate and is discharged to the outside of the system together with the concentrate, while the remaining amount of the polymer remains on the primary side (i.e., the feed side) of the separation membrane module and maintains the ability to capture metals until all the ion-exchange groups are bonded to metal ions. Accordingly, the metal contamination inhibitor may be added to the ultrapure water on a continuous or intermittent basis.

If all the ion-exchange groups of the polymer included in the metal contamination inhibitor are bonded to metals, it becomes not possible to capture and remove the metals contained in the ultrapure water. When the capability of removing the metals is reduced during intervals between the intermittent addition operations, an additional amount of the metal contamination inhibitor may be added to the water. Alternatively, an acid may be added to the water as described below in order to recover the removal ability. Specifically, when ultrapure water including an acid is passed through the separation membrane module, metal ions become desorbed and released from the polymer including an ion-exchange group on which the metals are adsorbed, the polymer being retained on the primary side of the separation membrane, and the polymer including an ion-exchange group is thereby regenerated. It is desirable to discharge the metal ions desorbed and released from the polymer by the regeneration treatment to the outside of the system together with the concentrate of the membrane in order to prevent the metal contamination of the permeate-side surface of the membrane. Metal ions freshly fed onto the primary side of the separation membrane become adsorbed to the regenerated polymer including an ion-exchange group and are thereby removed. In the case where continuous addition is performed, it is preferable to use an internal-pressure-type hollow fiber membrane module in order to prevent the metal contamination inhibitor added to the water and the metal ions from remaining inside the module and enable the metal contamination inhibitor and the metal ions to be discharged onto the concentrate side.

Examples of the acid used in the above case include hydrochloric acid, nitric acid, and other strong inorganic acids. The amount of the acid added to the ultrapure water is preferably about 1 mg/L to 100 mg/L.

Although the metal contamination inhibitor according to the present invention may include components other than the polymer including an ion-exchange group, the metal contamination inhibitor according to the present invention preferably includes only the polymer including an ion-exchange group in order to prevent the contamination of products.

The metal contamination inhibitor according to the present invention may be added to the ultrapure water at a position upstream of the separation membrane module. Alternatively, the metal contamination inhibitor may be deposited or fixed on the separation membrane, and the ultrapure water may be passed through a module that includes the separation membrane (i.e., the metal contamination inhibition membrane). It is particularly preferable to deposit or fix the metal contamination inhibitor on the primary-side surface of the separation membrane. When the metal-removal ability of the metal contamination inhibitor deposited or fixed on the separation membrane is reduced, it is possible to recover the metal-removal ability by passing, through the separation membrane, ultrapure water to which the above acid has been added.

The metal contamination inhibitor according to the present invention may be used in a subsystem of an ultrapure-water production apparatus. For example, when the subsystem includes a nonregenerative mixed-bed ion-exchange resin device, a pump, and a UF membrane device, it is preferable to add the metal contamination inhibitor to the water at a position that is downstream of the pump and upstream of the UF membrane device. In such a case, water-quality load caused by metals generated in the pump can be reduced with the metal contamination inhibitor. The metal contamination inhibitor may alternatively be used at a position downstream of the UF membrane device. Instead of the UF membrane device that serves as a final filter, a module that includes a metal contamination inhibition membrane on which the metal contamination inhibitor is deposited or fixed may be used. The structure of the subsystem is not limited to the above-described structure. The subsystem may include various ion-exchange resin devices, a UV oxidation device, a deaeration device, and the like. Any of the above units may be omitted.

In order to increase ion-exchange reaction rate, a certain amount of reaction time may be maintained by using a buffer tank or the like. Alternatively, stirring means, such as a line mixer, may be used. The above means may be disposed at any position downstream of the position at which the metal contamination inhibitor is added to the water. The lower limit for the reaction time is desirably larger than 1 second.

A method for cleaning a product according to the present invention in which the product is cleaned with the metal contamination inhibitor according to the present invention is described below.

In the method for cleaning a product according to the present invention, a product is cleaned with ultrapure water to which the metal contamination inhibitor according to the present invention has been added in the suitable amount described above. Alternatively, the product may be cleaned with membrane permeate produced by passing ultrapure water including the metal contamination inhibitor according to the present invention through the separation membrane module as described above.

The cleaning method is not limited, and immersion cleaning, spray cleaning, and the like may be used.

The metal contamination inhibitor according to the present invention is particularly suitably used for rinsing electronic components, such as wafers, after the electronic components have been cleaned with chemicals. Even without using high-purity ultrapure water from which metals have been removed at a high level, it is possible to prevent the metal contamination of products by trace metals contained in the ultrapure water which are adhered to the products and thereby enable the production of high cleanliness products by only adding a predetermined amount of the metal contamination inhibitor according to the present invention to the ultrapure water, by only passing, through the separation membrane module, the ultrapure water to which the metal contamination inhibitor has been added, or by only passing the ultrapure water through the separation membrane module (i.e., the metal contamination inhibition membrane module) on which the metal contamination inhibitor is deposited or fixed. This may prevent an increase in the costs required for increasing the purity of the ultrapure water to a high level.

Since the metal contamination inhibitor according to the present invention is used for removing trace metals contained in ultrapure water by adsorption, it is preferable that the metal contamination inhibitor be clean. For example, PSA (polystyrene sulfonic acid), which may be included in the metal contamination inhibitor, includes impurities mixed during production, such as trace metals, cations, and anions. In particular, the content of the anions may be a few to several hundred parts per million (ppm). Accordingly, it is preferable to refine PSA before use in order to remove the impurities to a minimum level.

It is possible to remove primarily anionic impurities by passing a stock solution of PSA which is diluted to a certain concentration through an ultrapure water-grade anion-exchange resin. Although PSA is an anionic component, PSA, which is also a high-molecular component, does not diffuse inside the anion-exchange resin and completely leaks from the anion-exchange resin without being captured by the anion-exchange resin. Therefore, the above operation does not reduce the purity or concentration of PSA.

In the same manner as above, cationic impurities and metal impurities can be removed from PSA using a cation-exchange resin. Since PSA is an anionic component, PSA does not become adsorbed to a cation-exchange resin. Note that, since cations and metals have a property of adsorbing to PSA, the impact of cations and metals on products which may occur when the products are cleaned with ultrapure water is negligible.

The content of Na ions in PSA may be large compared with the other metals because a process for producing PSA includes a step in which Na-type PSA is converted into H-type PSA by ion exchange. Accordingly, refining PSA using a cation-exchange resin is significant in order to maintain the performance of PSA.

PSQ (polystyrene quaternary ammonium salt), which may be included in the metal contamination inhibitor, includes impurities mixed during production, such as trace metals, cations, and anions. In particular, large amounts of cations (e.g., ammonia compounds) may be included in PSQ. Accordingly, it is preferable to refine PSQ before use in order to remove the impurities to a minimum level.

It is possible to remove primarily cationic impurities and metal impurities by passing a stock solution of PSQ which is diluted to a certain concentration through an ultrapure water-grade cation-exchange resin. Although PSQ is a cationic component, PSQ, which is also a high-molecular component, does not diffuse inside the cation-exchange resin and completely leaks from the cation-exchange resin without being captured by the cation-exchange resin. Therefore, the above operation does not reduce the purity or concentration of PSQ.

Optionally, trace anionic components of PSQ may be removed using an anion-exchange resin.

EXAMPLES

The present invention is described further specifically with reference to Examples below.

[Test I: Inhibition of Adhesion of Metals on Wafer]

<Test Conditions>

The test described below was conducted using the cleaning test apparatus illustrated in FIG. 1. Specifically, metals were added to ultrapure water at a concentration of 10 ng/L (reference mixed solution, the concentration of each metal), and a chemical was added to the resulting solution at a concentration of 30 µg/L (note that, no chemical was added in Comparative example I-1). The resulting solution was mixed in a line mixer 1 to prepare cleaning water, which was fed into a cleaning bath 2 and used for cleaning a wafer 3 in the cleaning bath 2.

After the wafer had been cleaned, the wafer was withdrawn from the water and left to stand until the wafer was dried. The amounts of metals adhered onto the surface of the dried wafer were measured by vapor phase decomposition-inductively coupled plasma-mass spectrometry (VPD-ICP-MS).

The metals added to the ultrapure water were Na, Al, Ca, Cr, Fe, Ni, Cu, and Zn. The following chemicals were used.

Example I-1: Polystyrene sulfonic scid (PSA)
    Example I-2: Polystyrene quaternary ammonium salt (PSQ)
    Comparative example I-1: No chemical was added
    Comparative example I-2: Crown ether (18-crown-6)
    Comparative example I-3: Ethylenediaminetetraacetic acid (EDTA)
    Comparative example I-4: Ethylenediamine tetramethylene phosphonic acid (EDTMP)

Comparative example I-5: Gluconic acid

<Results and Discussions>

Figure 2:
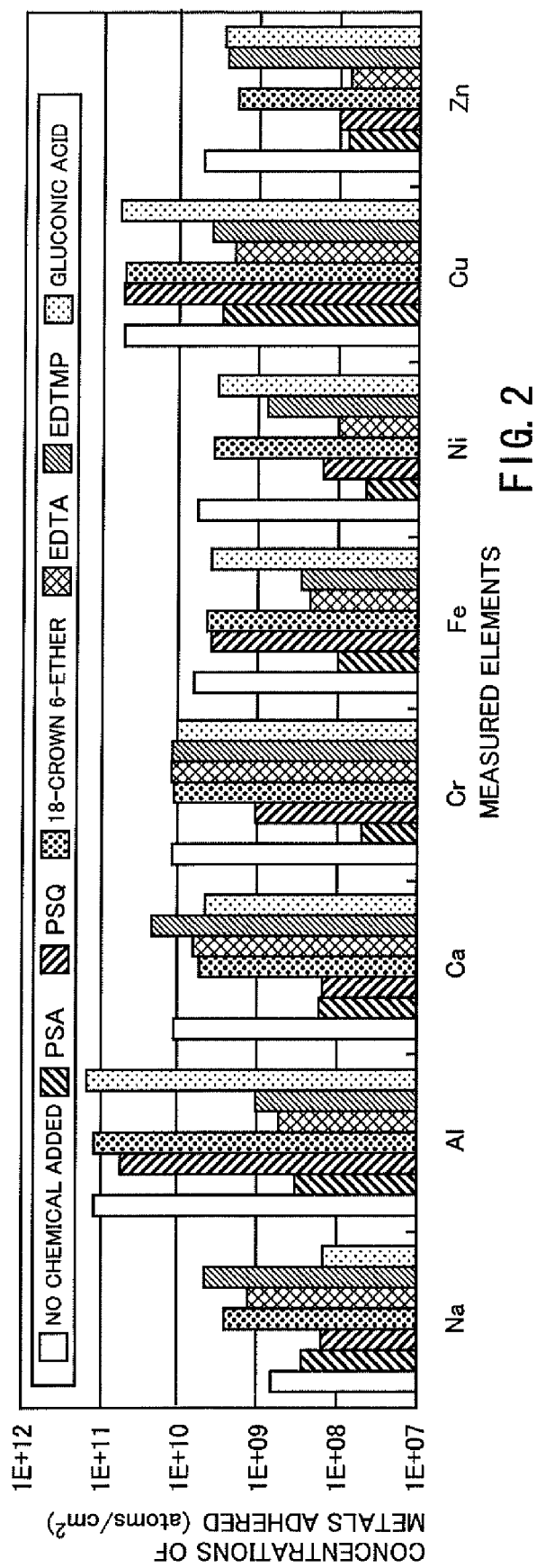
FIG. 2 is a graph illustrating the results obtained in Examples I-1 and I-2 and Comparative examples I-1 to I-5 of Test I.

FIG. 2 illustrates the amounts of metals adhered to each of the wafers used in Examples I-1 and I-2 and Comparative examples I-1 to I-5.

As is clear from the results shown in FIG. 2, PSA was capable of inhibiting all the polyvalent metals from adhering to the wafers, while each of the other chemicals selectively inhibited specific metals only. This confirms that PSA inhibits adhesion of metals in the most versatile manner. The next most versatile chemical was PSQ. The chelating agents such as EDTA and EDTMP and the other chemicals were capable of inhibiting adhesion of only a part of the metals.

The amount of PSA used in Example I-1 corresponds to about ten times the ion-exchange reaction equivalent ratio. The amount of PSQ used in Example I-2 corresponds to about ten times the ion-exchange reaction equivalent ratio.

[Test II: Removal of Metals Through UF Membrane]

<Test Conditions>

Figure 3:
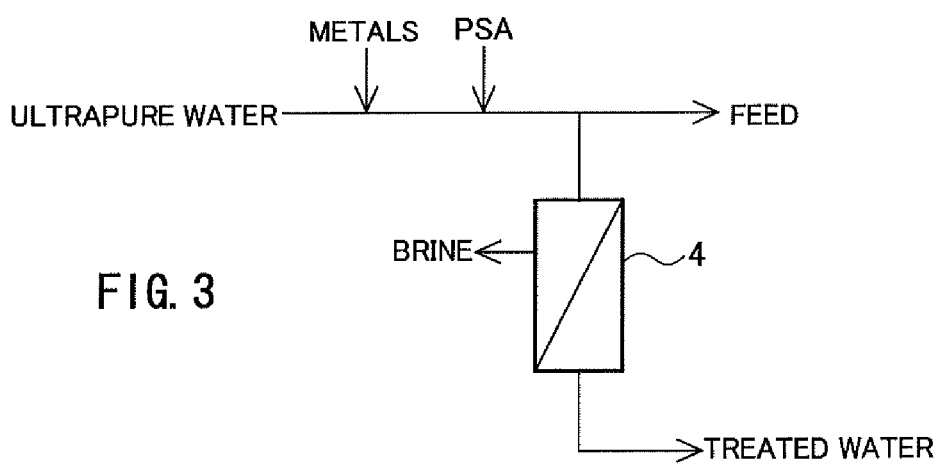
FIG. 3 is a system diagram illustrating a UF membrane test apparatus used in Tests II and III.

The test described below was conducted using the UF membrane test apparatus illustrated in FIG. 3. Specifically, metals were added to ultrapure water at a concentration of 100 ng/L (reference mixed solution, the concentration of each metal). PSA (molecular weight: one million) was added to the solution at a concentration of 30 µg/L (corresponds to about ten times the ion-exchange reaction equivalent ratio). The resulting water (note that, PSA was not added to the water in Comparative example II-1) was passed, as a feed, through a UF membrane module (cut-off molecular weight: 12000, PEG standards) 4. The concentrations of metals in each of the feed, the treated water (i.e., the membrane permeate), and the brine (i.e., the concentrate) were measured by inductively coupled plasma-mass spectrometry (ICP-MS).

The metals used were Li, Na, Mg, Al, K, Ca, Cr, Mn, Fe, Ni, Co, Cu, Zn, Ag, Cd, Ba, and Pb.

<Results and Discussions>

Figure 4:
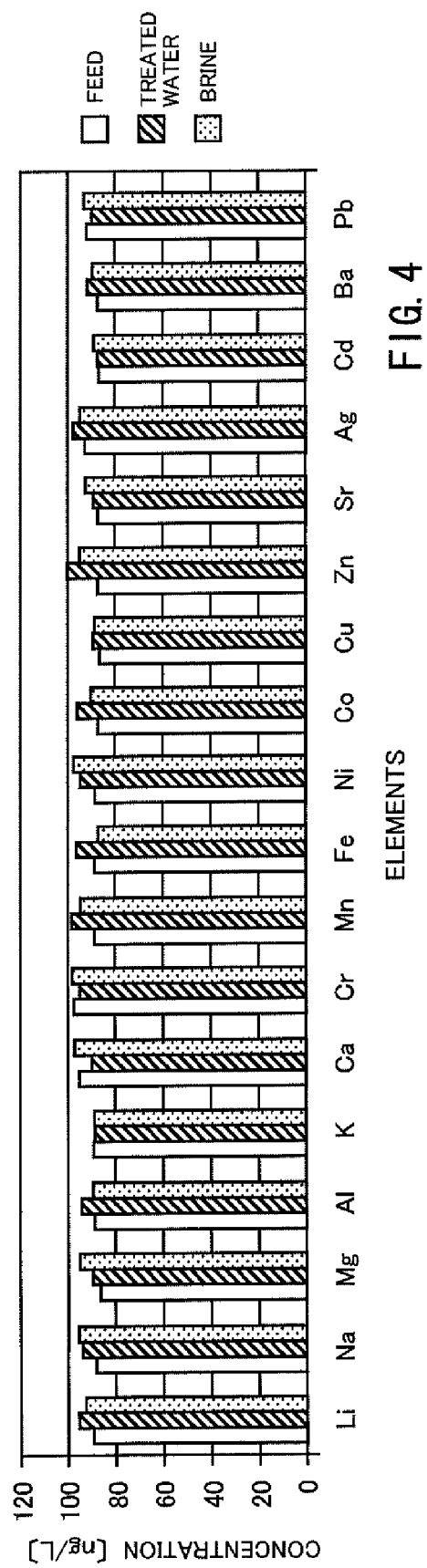
FIG. 4 is a graph illustrating the results obtained in Comparative example II-1 of Test II.
Figure 5:
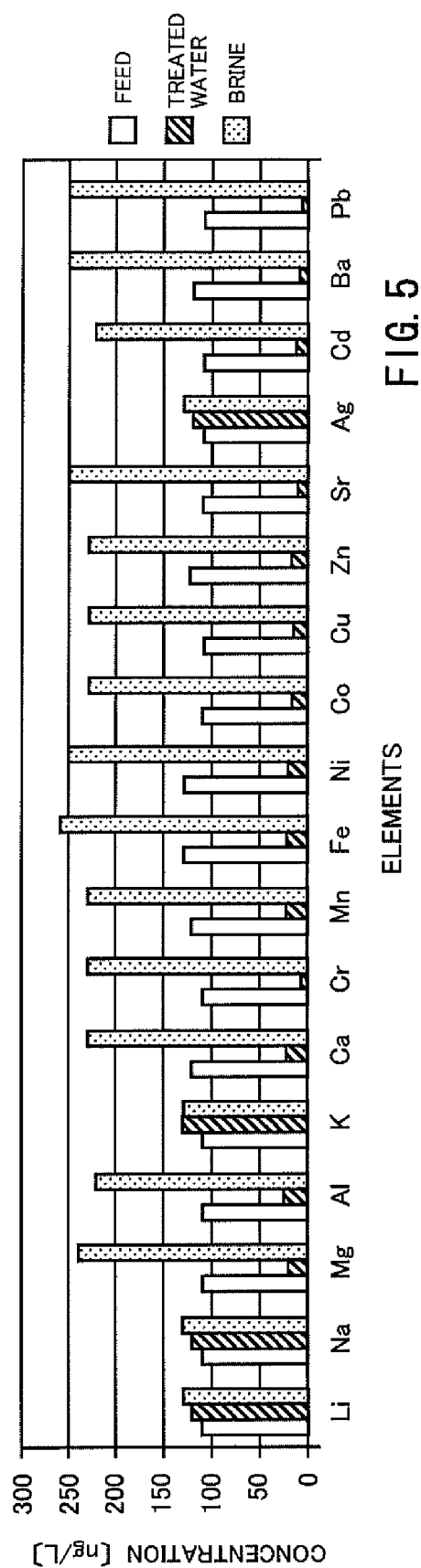
FIG. 5 is a graph illustrating the results obtained in Example II-1 of Test II.

FIGS. 4 and 5 illustrate the concentrations of the metals in each of the feed, the treated water, and the brine.

As is clear from the results shown in FIG. 4, in the case where PSA was not added to the water, the concentrations of any of the metals in the feed, the treated water, and the brine were not changed. As is clear from the results shown in FIG. 5, in the case where PSA was added to the water, the concentrations of polyvalent metals having a valence of two or more in the treated water were reduced by about 95% relative to the concentrations of the polyvalent metals in the feed. Since the PSA removal rate of the UF membrane measured in another test was 94%, it is considered that the reductions in the concentrations of the metals in the treated water were caused by the UF membrane blocking PSA on which the metals contained in the water had been captured.

[Test III: Regeneration of PSA Remaining on UF Membrane]

<Test Conditions>

The UF module used in Example II-1 was cleaned by passing ultrapure water through the UF module for seven days. Subsequently, high concentrations of metals and PSA were loaded on the UF module. The UF membrane was cleaned again by passing ultrapure water and nitric acid (0.001% of the amount of water passed) through the UF membrane. At a timing prior to loading and a timing subsequent to each of the cleaning steps, water to which the metals had been added at a concentration of about 10 ng/L was passed through the UF membrane, the concentrations of the metals in the treated water were analyzed by ICP-MS, and the permeation rates of the metals were determined (Example III-1).

<Results and Discussions>

FIG. 6 illustrates the rates at which the metals passed through the UF membrane subsequent to each of the steps.

As is clear from the results shown in FIG. 6, the permeation rates of the polyvalent metals measured prior to the loading of PSA were 5% to 10%. This indicates the PSA loaded on the membrane in the test of Example II-1 was retained on the membrane and removed the metals. Subsequent to the loading, the metals substantially passed through the UF membrane at permeation rates of 80% to 100%. However, it was confirmed that the permeation rates were reduced at each time when the UF membrane was cleaned with nitric acid. This confirms that PSA remains on the primary-side surface of the UF membrane and, while continuous loading of metals degrades the metal removal effect, cleaning the membrane with an acid recovers the metal removal effect. That is, the regeneration effect was confirmed.

The results obtained in Examples II-1 and III-1 show that adding the polymer including a cation-exchange group to the water on the primary side of the UF membrane on a continuous or intermittent basis reduces the concentration of metals in the treated water. The cation-exchange group included in the polymer retained on the primary-side surface of the UF membrane can be regenerated by acid cleaning. This indicates that the polymer can be used as a polisher capable of on-site regeneration.

[Test IV: Refining of PSA]

<Test Flow>

Into a beaker having an adequate volume, that is, about 500 mL, 50 to 100 mL of an anion-exchange resin was charged. Ultrapure water was charged into the beaker, the resin was slowly stirred, and supernatant ultrapure water was removed. The above decantation cleaning was repeated five or six times. Subsequently, 20 mL of the anion-exchange resin cleaned by decantation was charged into a glass column, through which about 300 mL of ultrapure water was slowly passed in order to perform cleaning. A stock solution of PSA was diluted 1000-fold. The diluted solution was dropped from the upper portion of the resin column by gravity and passed through the anion-exchange resin in order to perform refining (SV: about 10). The treated water was sampled. The sampled treated water was diluted 10-fold to prepare an analysis sample. The concentrations of metals (i.e., Na, Fe, Ni, and Ca), anions (i.e., SO4, PO4, and Br), and boron in the sample were analyzed. The PSA and the anion-exchange resin used were as follows.

PSA: PS-100H produced by Tosoh Corporation, 2.5%, molecular weight: 280 thousand Anion-exchange resin: SAT produced by Mitsubishi Chemical Corporation <Analysis Method>

(1) Ion chromatic analysis: for $SO_4^{2-}$, $PO_4^{3-}$, and $Br^-$, lower limit: 1 ppb (5 ppb for only $PO_4^{3-}$)

(2) ICP-MS analysis: for boron, lower limit: 0.5 ppb

<Results and Discussions>

Table 1 shows the analysis results. The actual-use estimated value in Table 1 is the concentration at which each of the items is contained in ultrapure water when the PSA is used as a metal contamination inhibitor in actual use. Table 2 shows the results of analyses of the TOC of PSA which were conducted before and after the PSA solution was passed through the anion-exchange resin.

TABLE 1

| Analyzed items | | Unit | Analyzed value | Before refining | Passing water through anion-exchange resin | Analyzed value (assumption) | Actual-use estimated value (18 metal elements, calculated assuming that the equivalent ratio of PSA/all metals is 5 when the concentration of each of the metal elements is 0.05 ng/L) | Unit |
|---|---|---|---|---|---|---|---|---|
| Metals | Na | mg/L | <1 | <10 | | 1 | 0.00147 | ng/L |
| | Fe | mg/L | <5 | — | | 5 | 0.00736 | ng/L |
| | Ni | mg/L | <20 | — | | 20 | 0.02944 | ng/L |
| | Ca | mg/L | <5 | — | | 5 | 0.00736 | ng/L |
| Anions | SO4 | mg/L | 220 | <150 | <10 | 10 | 0.01472 | ng/L |
| | PO4 | mg/L | 100 | — | <50 | 50 | 0.07360 | ng/L |
| | Br | mg/L | 880 | <700 | <10 | 10 | 0.01472 | ng/L |
| Boron | | mg/L | <100 | — | <5 | 5 | 0.00736 | ng/L |

TABLE 2

| | TOC/ppm |
|---|---|
| Before passing water through anion-exchange resin | 12.1 |
| After passing water through anion-exchange resin | 12.4 |

It was confirmed that refining PSA by passing the PSA solution through the anion-exchange resin removes the anionic components of PSA. It was also confirmed that the purity (i.e., the concentration) of PSA did not change substantially during the refining of PSA.

Although the present invention has been described in detail with reference to particular embodiments, it is apparent to a person skilled in the art that various modifications can be made therein without departing from the spirit and scope of the present invention.

The present application is based on Japanese Patent Application No. 2015-193799 filed on Sep. 30, 2015, which is incorporated herein by reference in its entirety.

REFERENCE SIGNS LIST

1 LINE MIXER
CLEANING BATH
3 WAFER
4 UF MEMBRANE MODULE

The invention claimed is:

1. A method for preventing metal contamination of a product by trace metals contained in ultrapure water, the method comprising:
adding a metal contamination inhibitor comprising a polymer including either a polystyrene sulfonic acid or a quaternary ammonium group to the ultrapure water, the polymer having an ion-exchange group and a molecular weight of 100,000 or more, wherein an amount of the metal contamination inhibitor added to the ultrapure water is 1 to 20 times of an ion exchange reaction equivalent ratio between the polymer having the ion-exchange group and the trace metals contained in the ultrapure water,
subsequent to adding the metal contamination inhibitor to the ultrapure water, removing metal contamination inhibitor with adsorbed trace metals from the ultrapure water by passing the ultrapure water through a module including a separation membrane, and
washing the product with the ultrapure water that was passed through the separation membrane.

2. The method for preventing metal contamination according to claim 1, wherein the trace metals have a valence of two or more.

3. A method for cleaning a product with ultrapure water, comprising:
adding a metal contamination inhibitor comprising a polymer including either a polystyrene sulfonic acid or a quaternary ammonium group to ultrapure water containing trace metals, the polymer having an ion-exchange group and a molecular weight of 100,000 or more, wherein an amount of the metal contamination inhibitor added to the ultrapure water containing trace metals is 1 to 20 times of an ion exchange reaction equivalent ratio between the polymer having the ion-exchange group and the trace metals contained in the ultrapure water,
subsequent to adding the metal contamination inhibitor to the ultrapure water, removing metal contamination inhibitor with adsorbed trace metals from the ultrapure water by passing the ultrapure water through a module including a separation membrane, and
cleaning the product with the ultrapure water passed through the separation membrane.

4. The method for cleaning a product according to claim 3, wherein the trace metals have a valence of two or more.

* * * * *